United States Patent [19]

Biraud

[11] Patent Number: 4,631,639
[45] Date of Patent: Dec. 23, 1986

[54] STUD AND A SUPPORT FOR FIXING AN ELECTRONIC COMPONENT TO A PRINTED CIRCUIT BOARD

[75] Inventor: Lucien Biraud, Fontenay-aux-Roses, France

[73] Assignee: Thomson CSF, Paris, France

[21] Appl. No.: 604,116

[22] Filed: Apr. 26, 1984

[30] Foreign Application Priority Data

Apr. 29, 1983 [FR] France .............................. 83 07182

[51] Int. Cl.[4] .............................................. H05K 7/04
[52] U.S. Cl. .................................. 361/417; 339/275 B; 361/400; 361/419; 361/420
[58] Field of Search ............... 339/275 B, 275 R, 388; 361/400, 403, 406, 417, 419, 420

[56] References Cited

U.S. PATENT DOCUMENTS

| | | | |
|---|---|---|---|
| 3,621,445 | 11/1971 | Horecky | 339/275 B |
| 3,861,030 | 1/1975 | Otte et al. | 29/626 |
| 4,056,302 | 11/1977 | Braun et al. | 339/275 B |
| 4,060,296 | 11/1977 | Kunkle et al. | 339/17 CF |
| 4,296,993 | 10/1981 | Wellington | 339/275 B |

FOREIGN PATENT DOCUMENTS

| | | |
|---|---|---|
| 0375691 | 6/1932 | Fed. Rep. of Germany ...... 339/275 |
| 1315948 | 12/1961 | France . |
| 1521180 | 4/1966 | France . |

OTHER PUBLICATIONS

R. Darrow et al., "Substrate Pinning Process Using a Pressed Tapered Pin", IBM Technical Disclosure Bulletin, vol. 21, No. 12, May 1979, pp. 4798-4799.

Primary Examiner—A. D. Pellinen
Assistant Examiner—Gregory D. Thompson
Attorney, Agent, or Firm—Cushman, Darby & Cushman

[57] ABSTRACT

A stud and support arrangement are provided for supporting and fixing electronic components on integrated circuit boards. Studs are provided having an abutment for accurately positioning the integrated circuit and facilitating soldering thereof. The stud has a semi-open structure for receiving the lug of an electric component. The lug is soldered to the stud. The electronic component may be easily separated from the integrated circuit because the semi-open structure enables each lug to be unsoldered and removed, one-by-one, thus alleviating the need to unsolder all lugs at one time.

10 Claims, 6 Drawing Figures

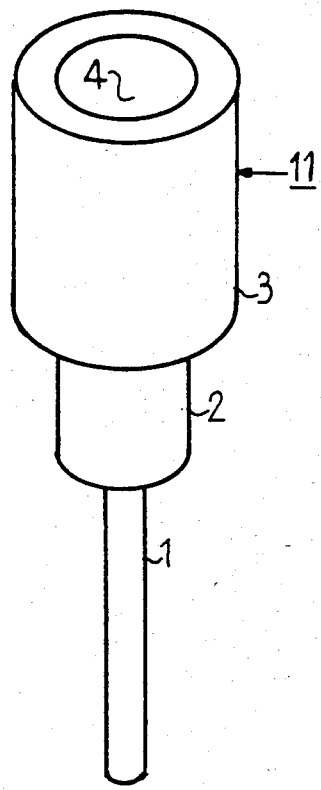
FIG_1
(PRIOR ART)
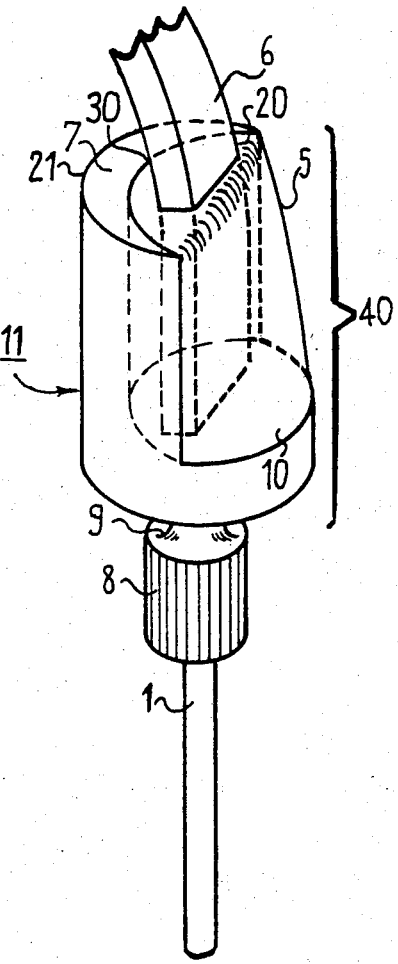
FIG_2
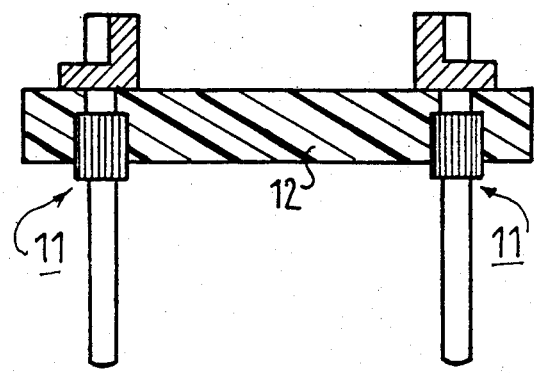
FIG_3

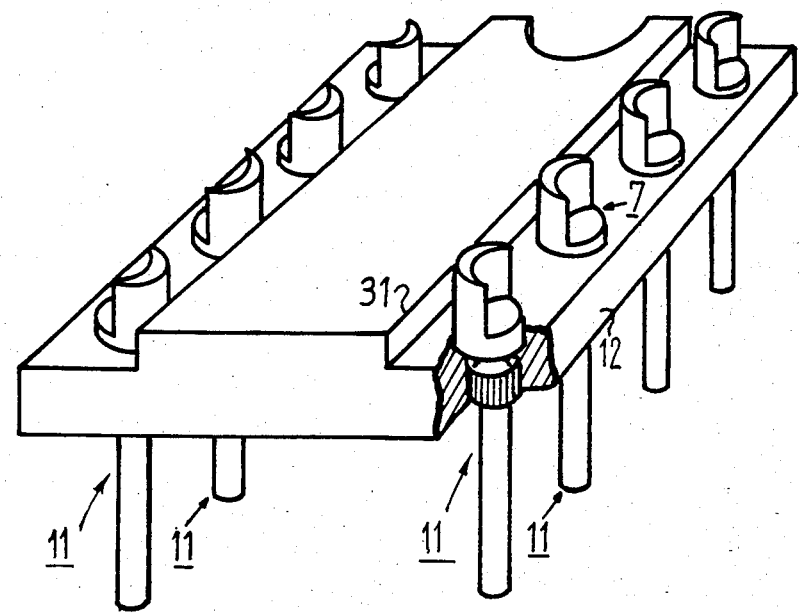
FIG_4
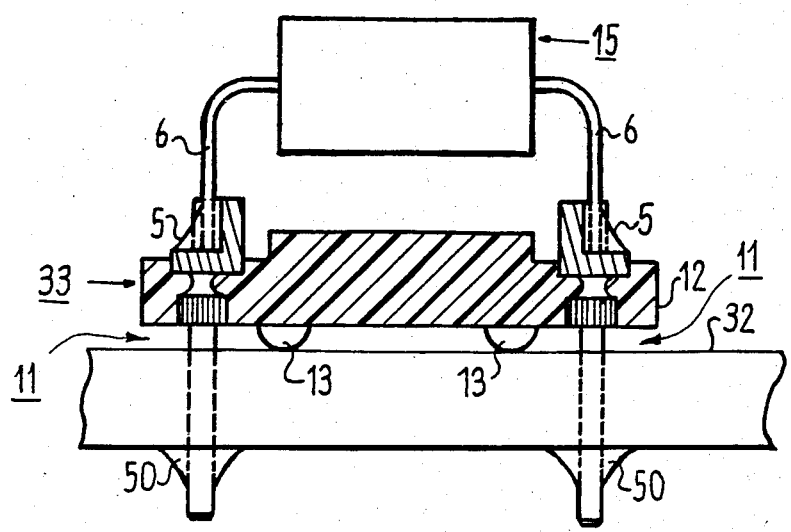
FIG_5

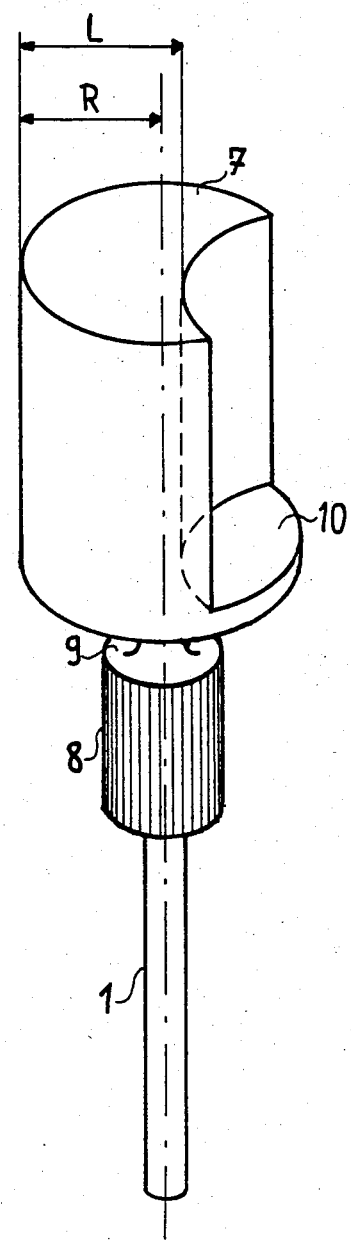

STUD AND A SUPPORT FOR FIXING AN ELECTRONIC COMPONENT TO A PRINTED CIRCUIT BOARD

BACKGROUND OF THE INVENTION

1. Field of the Invention

The present invention relates to fixing electronic components on printed circuit boards and more particularly to support studs for fixing an electronic component on a printed circuit board and a support comprising these studs.

2. Description of the Prior Art

Some components must be changed during the life of the printed circuit board, either because of a defect or for reasons related to the development of materials. Thus, when a more elaborate program has been perfected, the read only memories of the PROM type containing these programs are replaced. PROM memories are memories which can only be programmed once. The instruction of the program or the stored data can no longer be modified at will. Successive soldering and unsoldering operations adversely affect the reliability of the printed circuit boards. Double face printed circuit boards and multi layer printed circuit boards are the most fragile to a temperature rise. So intermediate supports are used for fixing an electronic component to the printed circuit board. Usually, the support is soldered to a printed circuit board. The use of two types of support are known for fixing integrated circuit boards to printed circuits. A first type of support allows plugging in the printed circuit boards and has the advantage of ready replacement of printed circuit boards without unsoldering or soldering. However, in the presence of vibrations, the support-integrated circuit electric connections risk being interrupted. This type of interruption, even though they only last an extremely short time, is very serious for digital circuits. If logic circuits are used, the logic state following these interruptions is indifferent. Furthermore, the support for plugging into the integrated circuit of the known type takes up considerable space in a vertical direction to allow plugging in. A second type of support which allows the integrated circuits of the known type to be soldered is formed by studs made from a conducting material shown in FIG. 1, joined together by a wafer of insulating material. As is explained below, this type of support presents difficulties for unsoldering the integrated circuits which it supports.

SUMMARY OF THE INVENTION

The support of the invention comprises semi-open studs providing reliable fixing of the integrated circuit by using solder and is readily unsoldered.

The invention essentially provides support studs for fixing electronic components to a printed circuit board, said stud comprising a pin for fixing the support, and the electric connection of the lug of the electronic component and of the printed circuit board, wherein the part of said stud intended to receive a lug of the component to be fixed comprises at least one stop, positioning said terminal, the side opposite said stud being open.

BRIEF DESCRIPTION OF THE DRAWINGS

The invention will be better understood from the following description and the accompanying Figures given as non limiting examples in which:

FIG. 1 is a perspective view of an integrated circuit board support stud of a known type;

FIG. 2 is a perspective view of a modification of a stud for supporting electronic components in accordance with the invention;

FIG. 3 shows in section a variant of the support of the invention;

FIG. 4 is a perspective view of another variant of the support of the invention;

FIG. 5 is a sectional view of the support mounted on a printed circuit equipped with an integrated circuit; and FIG. 6 is a perspective view of a second variant of a stud for supporting electronic components in accordance with the invention.

DESCRIPTION OF THE PREFERRED EMBODIMENTS

In FIG. 1 can be seen a support stud of a known type for integrated circuits. The support is formed by a wafer of insulating material, not shown in the Figure, positioning the studs with the same spacing as the lugs of the ingetrated circuit which said support is designed to secure.

Stud 11 comprises a pin 1 for soldering to a printed circuit board.

A shoulder 2 forms the space between the printed circuit board and the integrated circuit supports. With the cylindrical part 3, the stud is fixed in the wafer. Stud 11 has in its upper part a recess 4, for receiving a connecting lug of the integrated circuit. Once the lug has been introduced into the recesses 4 of stud 11, it is soldered thereto for reliably securing the integrated circuit. For unsoldering the integrated circuit having this type of support, all the lugs must be unsoldered at the same time. If attempts are made to unsolder a single lug, since, on the one hand it can not be removed when the solder is fluid for the lug remains secured to the integrated circuit which is still fixed by the other lugs and, on the other hand, since recess 4 is closed all the solder cannot be sucked up, the lug remains soldered to its support. To unsolder all the lugs at the same time requires special equipment.

In FIG. 2, a stud 11 can be seen for supporting an electric component in accordance with the invention. The stud 11 is made from metal. Stud 11 comprises an abutment surface 7 and a base 10 on which bears a lug 6 of an integrated circuit for example. One face 20 of abutment 7 adapted to receive lug 6 is concave.

Thus, the part 40 of stud 11, intended to receive lug 6, is open on the side opposite the abutment 7. Advantageously, face 20 is a cylinder with elliptic or circular base.

A drop of solder 5 is placed between wall 20 and base 10. In the embodiment shown in FIG. 2, the external face of abutment 7 is cylindrical. Stud 11 can be fixed in the wafer by means of a cylindrical part 8. Advantageously, cylindrical part 8 comprises vertical grooves providing improved fixing of stud 11 in the wafer. Advantageously, stud 11 comprises between base 10 and the cylindrical part 8 a necked portion 9. The necked portion 9 limits the transfer of heat to the printed circuit board. A pin 1 provides for fixing the support on the printed circuit board. Advantageously, pin 1 has a standard electric component diameter so as to be able to fit for example a standard hole with a diameter of 0.85 mm.

In FIG. 3, a first embodiment of the support of the invention can be seen. This support comprises two rows of studs 11 fixed to a right angled parallelepiped wafer 12. The support of the invention comprises a number of studs 11 at least equal to the number of lugs 6 of the electric component to be fixed. Advantageously, wafer 12, in which studs 11 are fixed, is formed from a heat hardenable resin. Thus, it has a good resistance to humidity, to temperature changes and to the solvent. Advantageously, studs 11 are embedded in a material forming wafer 12. The position of studs 11 is chosen so that an integrated circuit to be soldered can rest on its support even before this soldering operation. Advantageously, the lugs of the integrated circuit are spaced apart and are resiliently held in position by bearing against edge 30 of face 20 of the stud of FIG. 2. Thus, terminals 6 do not bear over the whole height of face 20, which facilitates unsoldering and sucking up the solder.

In FIG. 4 a second embodiment of the support of the invention can be seen. Wafer 12 has a reinforcement 31 between the two rows of studs 11 which does not increase the vertical space required by the support.

In FIG. 5, a support 33 in accordance with the invention can be seen carrying an integrated circuit 15 with two rows of lugs (called DUAL IN LINE). Support 33 is fixed to a printed circuit board 32 by studs 11 which pass through the printed circuit board to which they are soldered by the solder 50. Bosses 13 form a space between the support and the printed circuit board. This space allows more especially cleaning of the printed circuit board.

The support of the invention provides reliable fixing without electric power cut off under temperature conditions varying from $-55°$ to $+125°$ C. Similarly, the electric connections have been provided by subjecting the printed circuit board equipped with the support in accordance with the invention comprising an integrator circuit to a sinusoidal acceleration of amplitude 981 m s$^{31 2}$ and whose frequency is varied between 10 and 200 Hz.

Because of the performances of the support of the invention, it can be used in very difficult conditions such for example as electric equipment for aircraft or missiles.

In FIG. 6 can be seen a stud 11 in accordance with the invention comprising an abutment 7 of width $L > R$, R being the radius of the base 10 of stud 11. Thus, a support comprising studs 11 having the same spacing as that of the lugs of the electric component to be fixed will have the distance between abutment 7 of the studs to be greater than the distance between the lugs 6 of the electronic component 15. Thus, to fix the lugs and studs together for soldering, the lugs 6 must be resiliently spread apart (see FIG. 5). The electronic component 15 is held in position for soldering by the resilience of the lugs 6. Thus, the support of the invention can be used on existing printed circuit boards comprising a spacing between holes corresponding to the spacing between the lugs of the electronic component.

The invention is not limited to the support for integrated circuits. Supports for all electronic components such for example as transistors, diodes, transformers, rectifier bridges, resistors, capacitors, or batteries remain within the scope of the present invention.

What is claimed is:

1. A stud for fixing an electronic component to a printed circuit board, said stud comprising:
   a pin fixing said stud on a printed circuit board, said stud supporting an electronic component having lugs, said pin electrically connecting said lugs of said electronic component to said printed circuit board; and
   means receiving said lug, said receiving means including at least one abutment portion having an abutment face which by abutting said lug, positions said lug to said stud, the portion of said receiving means opposite said abutment portion being open to the extent that said lug has unhindered access to said abutment face and abuts said abutment portion on said abutment face, and said abutment portion being open to the extent that solder can be withdrawn.

2. A stud as claimed in claim 1, wherein said abutment face is concave.

3. A stud as claimed in claim 1, wherein said stud further includes a necked portion disposed between said lug receiving means and said pin.

4. A stud as claimed in claim 1, wherein said lug receiving means has an annular base and said abutment portion has a width greater than the radius of said base.

5. A support arrangement for an electronic component comprising:
   a plurality of support studs supporting an electronic component having a plurality of lugs, on a printed circuit board each of said studs including,
   a pin electrically connecting one of said lugs of said electronic component to said printed circuit board,
   means receiving one of said lugs, said receiving means including at least one abutment portion having an abutment face which by abutting said lug, positions said lug to said stud, the portion of said receiving means opposite said abutment portion being open to the extent that said lug has unhindered access to said abutment face and abuts said abutment portion on said abutment face and to the extent that solder can be withdrawn; and
   structural means supporting said support studs, with a portion of each of said support studs being fixed in said structural means.

6. A support arrangement as claimed in claim 5, wherein said structural supporting means includes a wafer formed from a heat hardenable resin.

7. A support arrangement as claimed in claim 5, further including a plurality of bosses disposed between said structural supporting means and said structural printed circuit board forming a space between said supporting means and said printed circuit board.

8. A support arrangement as claimed in claim 5, wherein:
   said plurality of support studs, with a portion of each of said support studs, being fixed in said structural supporting means;
   said lugs are disposed on said electronic component and are resiliently bendable; and
   said disposition of said plurality of studs in said structural supporting means has spacing between said studs greater than the spacing of said lugs disposed on said electronic component so that when said electronic component is supported by said support arrangement, said lugs are resiliently bent to abut said stud abutment portion thus positioning said electronic component via said lugs to said support arrangement via said studs.

9. A support arrangement as claimed in claim 5, wherein said electronic component is an integrated circuit.

10. A support arrangement as claimed in claim 5, wherein said electronic component is an integrated circuit having dual, in line, rows of lugs.

* * * * *